United States Patent
Fan et al.

(10) Patent No.: US 6,894,339 B2
(45) Date of Patent: May 17, 2005

(54) FLASH MEMORY WITH TRENCH SELECT GATE AND FABRICATION PROCESS

(75) Inventors: Der-Tsyr Fan, Hsinchu (TW); Jung-Chang Lu, Hsinchu (TW); Chiou-Feng Chen, Hsinchu (TW); Prateep Tuntasood, Santa Clara, CA (US)

(73) Assignees: Actrans System Inc., Hsinchu (TW); Actrans System Incorporation, USA, Santa Clara, CA (US)

( * ) Notice: Subject to any disclaimer, the term of this patent is extended or adjusted under 35 U.S.C. 154(b) by 24 days.

(21) Appl. No.: 10/336,639

(22) Filed: Jan. 2, 2003

(65) Prior Publication Data

US 2004/0130947 A1 Jul. 8, 2004

(51) Int. Cl.[7] .............................................. H01L 29/76
(52) U.S. Cl. ........................ 257/314; 257/315; 257/316
(58) Field of Search ................................. 257/314, 315, 257/316

(56) References Cited

U.S. PATENT DOCUMENTS

| | | | |
|---|---|---|---|
| 5,675,161 A | * 10/1997 | Thomas | 257/316 |
| 6,091,104 A | 7/2000 | Chen | 257/326 |
| 6,291,297 B1 | 9/2001 | Chen | 438/265 |
| 6,426,896 B1 | 7/2002 | Chen | 365/185.26 |
| RE37,959 E | * 1/2003 | Komori et al. | 438/258 |
| 6,580,641 B2 | * 6/2003 | Wu et al. | 365/185.18 |
| 6,696,724 B2 | * 2/2004 | Verhaar | 257/314 |
| 2004/0000688 A1 | * 1/2004 | Harari et al. | 257/315 |
| 2004/0057286 A1 | * 3/2004 | Chene et al. | 365/185.17 |

* cited by examiner

*Primary Examiner*—Christian Wilson
(74) *Attorney, Agent, or Firm*—Edward S. Wright

(57) ABSTRACT

Flash memory and process of fabrication in which memory cells are formed with select gates in trenches between stacked, self-aligned floating and control gates, with buried source and drain regions which are gated by the select gates. Erase paths are formed between projecting rounded edges of the floating gates and the select gates, and programming paths extend from the mid-channel regions between the select gates and floating gates through the gate oxide to the edges of the floating gates. Trenched select gates can be provided on one or both sides of the floating and control gates, depending upon array architecture, and the stacked gates and dielectric covering them are used as a self-aligned mask in etching the substrate and other materials to form the trenches.

39 Claims, 20 Drawing Sheets

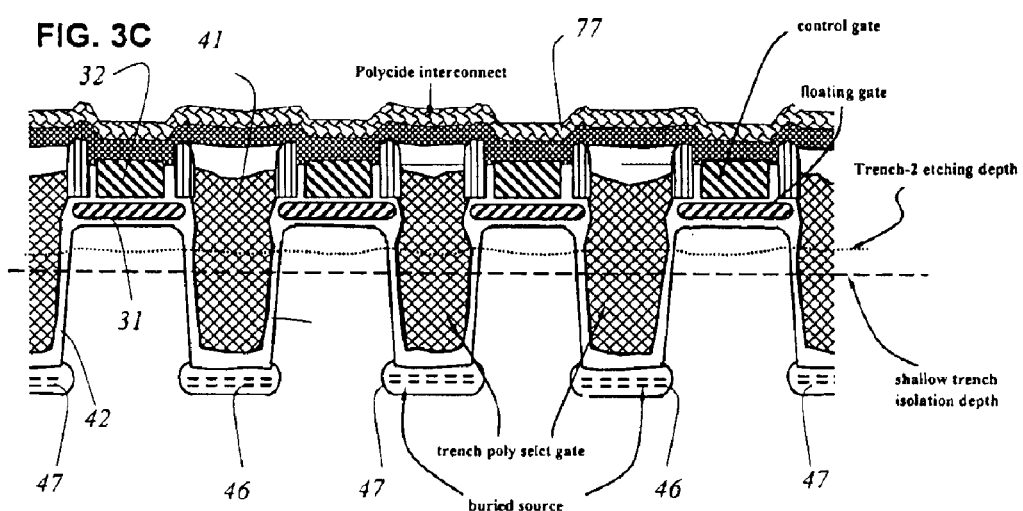

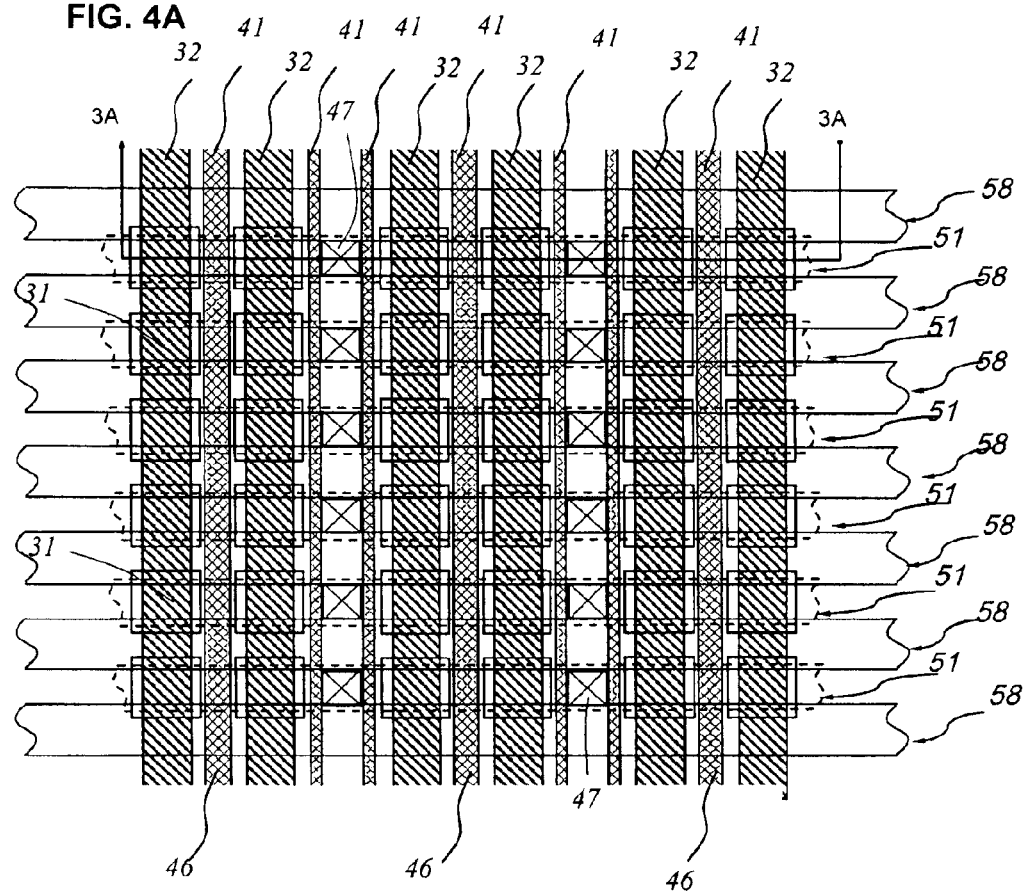

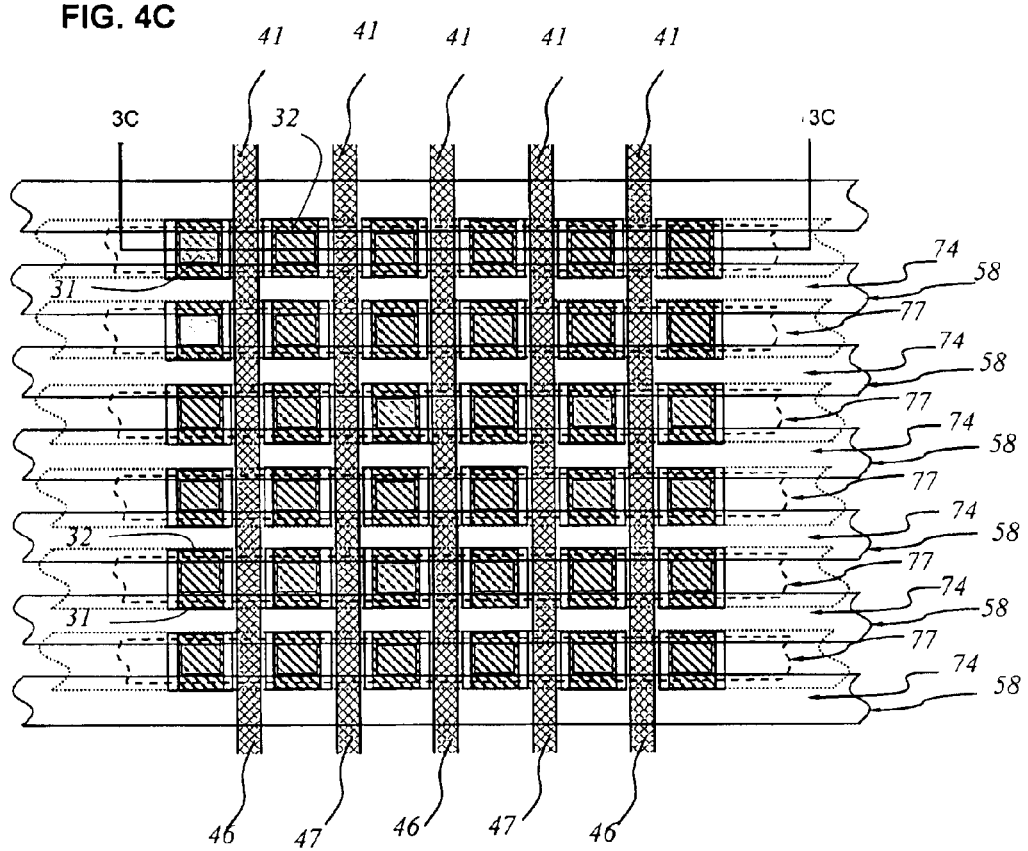

FLASH MEMORY WITH TRENCH SELECT GATE AND FABRICATION PROCESS

BACKGROUND OF THE INVENTION

1. Field of Invention

This invention pertains generally to semiconductor memory devices and, more particularly, to a self-aligned split-gate flash memory and process of fabricating the same.

2. Related Art

Nonvolatile memory is currently available in several forms, including electrically programmable read only memory (EPROM), electrically erasable programmable read only memory (EEPROM), and flash EEPROM. Flash memory has been widely used for high volume data storage in devices such as memory cards, personal digital assistants (PDA's) and MP3 players. Such applications require high density memory, with smaller cell size and reduced cost of manufacture.

In general, there are two basic types of nonvolatile memory cell structures: stack-gate and split-gate. The stack-gate memory cell usually has a floating gate and a control gate, with the control gate being positioned directly above the floating gate. In a split-gate cell the control gate is still positioned above the floating gate, but it is offset laterally from it. The fabrication process for a stack-gate cell is generally simpler than that for a split-gate cell. However, a stack-gate cell has an over-erase problem which a split-gate cell does not have. This problem is commonly addressed by maintaining the threshold voltage of the cell in a range of about 1.0–2.0 volts after an erase cycle, which adds complexity to the circuit design.

Although a split-gate memory cell has no over-erase problem, it generally includes an additional gate known as a select gate. Such cells are typically fabricated in double-poly or triple-poly processes which involve relatively complex processing steps. In addition, split-gate cells are generally larger than stack-gate cells. Nevertheless, because of the relatively simple circuit design which is possible when there is no over-erase problem, split-gate cells are used widely, particularly in embedded nonvolatile memory applications.

U.S. Pat. Nos. 6,091,104 and 6,291,297 disclose a split-gate memory cell of relatively small size, with efficient erase performance and a small programming current, and a portion of an array of such cells is illustrated in FIG. 1. Each cell has a floating gate 21 and a control gate 22 which are stacked vertically, with the control gate above the floating gate. A select gate 23 is positioned to one side of stacked gates. Source regions 24 are formed in substrate 26 between the floating gates in adjacent pairs of cells, and a drain region 27 is formed in the substrate between the select gates. A bit line 28 is connected to the drain region by a bit line contact 29.

In the program mode, the control gate is biased at a voltage of about 10 volts, the select gate is biased at −2 volts, and the source is biased at 6 volts. A relatively high positive voltage is coupled from the control gate to the floating gate, and a strong electric field is established across the mid-channel gate oxide 31 between select gate 23 and floating gate 21. This causes electrons to accelerate and inject into the floating gate.

In the erase mode, a negative voltage of about −9 volts is applied to the control gate, and a positive voltage of about 6 volts is applied to the select gate. This produces a strong electric field across the inter-poly oxide 32 between the select gate and the rounded edge of the floating gate, which initiates Fowler-Nordheim tunneling, with electrons migrating from the floating gate to the select gate.

Even though this approach permits in a smaller cell size than the widely used ETOX technology, the need for a select gate in addition to the stacked control and floating gates limits its utility as cell sizes continue to decrease toward hundreds of nanometers.

OBJECTS OF SUMMARY OF THE INVENTION

It is in general an object of the invention to provide a new and improved flash memory and process for fabricating the same.

Another object of the invention is to provide a flash memory and process of the above character which overcome the limitations and disadvantages of the prior art.

These and other objects are achieved in accordance with the invention by providing a flash memory and process of fabrication in which memory cells are formed with select gates in trenches between stacked, self-aligned floating and control gates, with buried source and drain regions which are gated by the select gates. Erase paths are formed between projecting rounded edges of the floating gates and the select gates, and programming paths extend from the mid-channel regions between the select gates and floating gates through the gate oxide to the edges of the floating gates. Trenched select gates can be provided on one or both sides of the floating and control gates, depending upon array architecture, and the stacked gates and dielectric covering them are used as a self-aligned mask in etching the substrate and other materials to form the trenches.

BRIEF DESCRIPTION OF THE DRAWINGS

FIG. 3C is cross-sectional views taken along line 3C—3C in FIG. 4C of another embodiment of a flash memory array incorporating the invention.

FIGS. 4A–4C are top plan views of the embodiments of FIGS. 3A–3C.

DETAILED DESCRIPTION

Figure 2A:
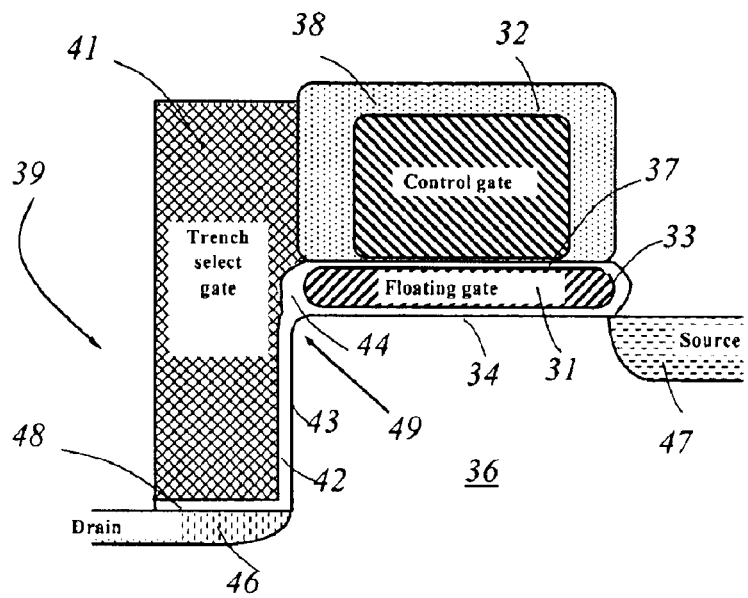
FIG. 2A is a cross-sectional view of one embodiment of a flash memory cell incorporating the invention.

As illustrated in FIG. 2A, the memory cell has a floating gate 31 and a control gate 32, with the control gate being positioned above and in vertical alignment with the floating gate.

The floating gate is fabricated of a conductive material such as polysilicon or amorphous silicon, with a preferred thickness on the order of 100 Å to 1000 Å and sharply curved side walls 33. A thin gate insulator 34, typically a thermal oxide, separates the floating gate from the silicon substrate 36 beneath it.

The control gate is narrower in horizontal dimension and thicker in vertical dimension than the floating gate, with the edges of the floating gate extending laterally beyond the edges of the control gate. The control gate is fabricated of a conductive material such as a doped polysilicon or polycide, and it is insulated from the floating gate beneath it by a dielectric film 37. That film can be either a pure oxide or a combination of oxide, nitride and oxide (ONO), and in one presently preferred embodiment, it consists of a layer nitride between two layers of oxide.

A relatively thick dielectric cap 38, e.g., oxide or nitride, covers the upper surface and side walls of the control gate.

A shallow trench 39 is formed in the upper portion of the substrate to one side of the stacked gates. A select gate 41 extends into the trench, with a gate oxide 42 between the select gate and the side wall 43 of the trench. The select gate is fabricated of a conductive material such as a doped polysilicon or polycide, and a relatively thin tunnel oxide 44 separating the select gate from the floating gate. Both the dielectric film and the tunnel oxide can be either a pure thermal oxide or a combination of thermal oxide and a CVD oxide.

The side wall of the trench can be perpendicular to the surface of the substrate, or it can be inclined downwardly and inwardly at an angle on the order of 90° to 120° relative to the surface.

The trench has a depth on the order of 1000 Å to 6000 Å in which the select gate is positioned horizontally beside the floating gate and the control gate. The select gate extends from the lower portion of the trench to a height above the floating gate but no higher than the dielectric cap on the control gate.

In this embodiment, a bit line drain region 46 is formed in the substrate beneath the lower wall of the trench, and a source region 47 is formed in the surface of the substrate on the side of the stacked gates opposite the trench. A thin oxide layer 48 insulates the select gate from the drain region.

With the select gate extending into the trench, cell size is greatly reduced, and burying the drain region beneath the trench provides a further saving of chip area as compared with cells having coplanar source and drain regions.

Another advantage of the vertically extending, trench select gate is that programming and erase performance are greatly enhanced over memory cells of the prior art. In the erase mode, this structure minimizes the re-entrant angle near the bottom corner of the select gate due to oxidization of the side wall of the floating gate. That eliminates the possibility of reverse tunneling from the re-entrant angle of the select gate to the floating gate.

In an erase operation, control gate 32 is biased negatively to −9 volts, and the vertically extending, trench select gate is biased positively to 6 volts. The strong coupling between control gate 32 and floating gate 31 and the very weak coupling from the select gate to the rounded edge 33 of the floating gate result in very strong electron coupling from the floating gate to the trenched portion of the select gate. Similar erase tunneling can also be achieved by grounding the control gate and biasing the select gate more positively.

In the programming mode, the control gate is biased at a voltage on the order of 10 volts, and the trench select gate is biased at about 2 volts, with the drain region at ground potential and the source node biased as about 6 volts. With these biasing conditions, most of the drain-to-source voltage falls across mid-channel region 49 near the shoulder of the shallow trench where a strong electric field is thus established. Being closely coupled to the control gate, the floating gate is at a higher voltage level than the mid-channel region, and a vertical electric field is thus formed. The vertical movement of electrons toward the rounded edge of the floating gate enhances the injection of electrons into the floating gate, which permits the use of an even lower source node voltage during programming operations.

Figure 2B:
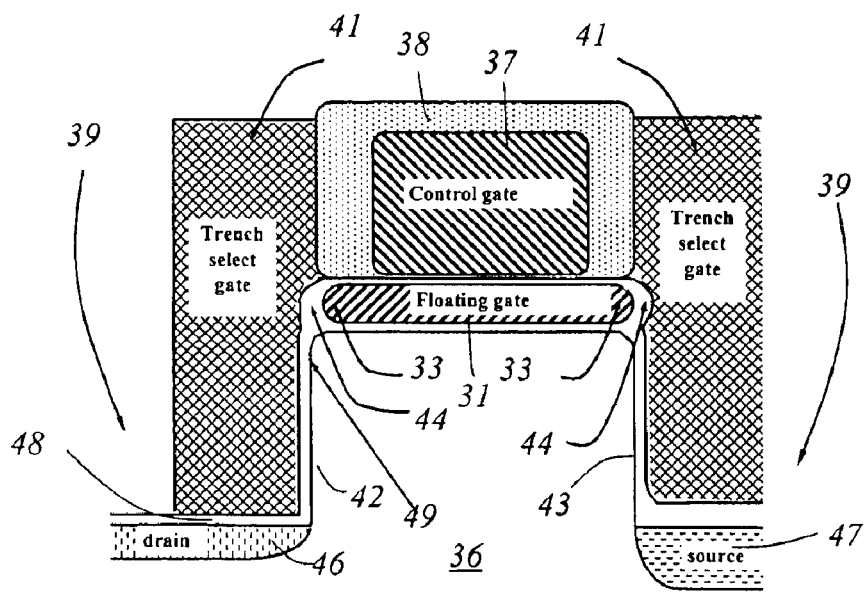
FIG. 2B is a cross-sectional view of another embodiment of a flash memory cell incorporating the invention.

The embodiment of FIG. 2B differs from the embodiment of FIG. 2A in that a second trench 39 is formed in the substrate on the side of the stacked gates opposite the first trench, source region 47 is buried in the substrate beneath the second trench, and an additional select gate 41 is formed on that side of the stacked gates and extends into the second trench.

The second trench select gate permits two-sided erase operations, which doubles the erase efficiency of the cell.

For programming, the source side select gate is either biased to a level of 6–7 volts by connecting it to the source node, or it is independently biased to a level of 6.5–7.7 volts to allow the 6–7 volt source node voltage to pass to the floating gate. As in the embodiment of FIG. 2A, most of the drain-to-source voltage falls across the mid-channel region near the shoulder of the shallow trench and establishes a strong electric field there. Here again, the floating gate is at a higher voltage than the mid-channel region, forming a vertical field which enhances electron injection into the floating gate.

During read operations, the source node is grounded, and the source select gate, which may be tied to the source node in other embodiments, is biased slightly higher than the source voltage. Similarly, the drain region is biased at −2 volts, and the drain-side select gate is biased to $V_{cc}$ to allow sufficient conducting channel.

Figure 3A:
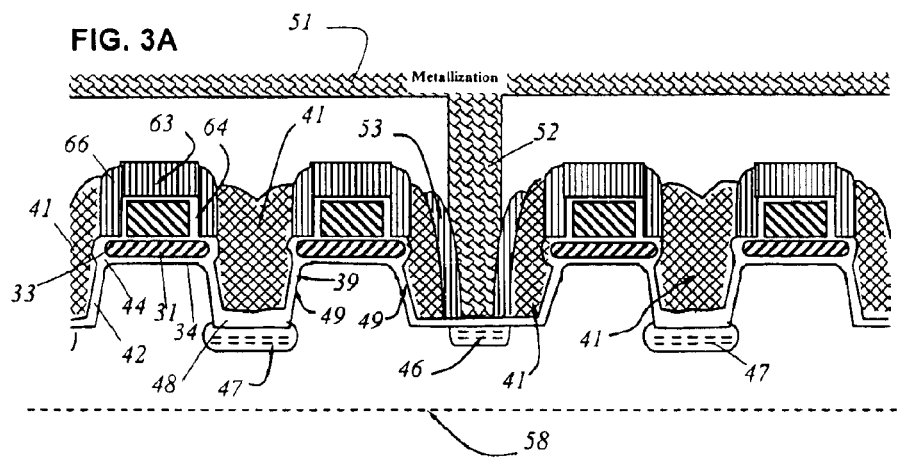
FIG. 3A is cross-sectional views taken along line 3A—3A in FIG. 4A of one embodiment of a flash memory array incorporating the invention.

FIGS. 3A and 4A illustrate a NOR flash memory array with trench select gates. This array is similar to that of FIG. 2B in that select gates 41 are provided on both sides of each stacked pair of floating and control gates 31, 32, and both the drain regions 46 and the source regions 47 are buried beneath the bottom walls of trenches 39.

The trenches on the drain side of the stacked gates are wider than the trenches on the source side, and a bit line 51 is connected to the drain regions by bit line contacts 52 which extend into the drain-side trenches, with dielectric spacers 53, e.g. silicon nitride, insulating the bit line contacts from the drain-side select gates.

Figure 1:
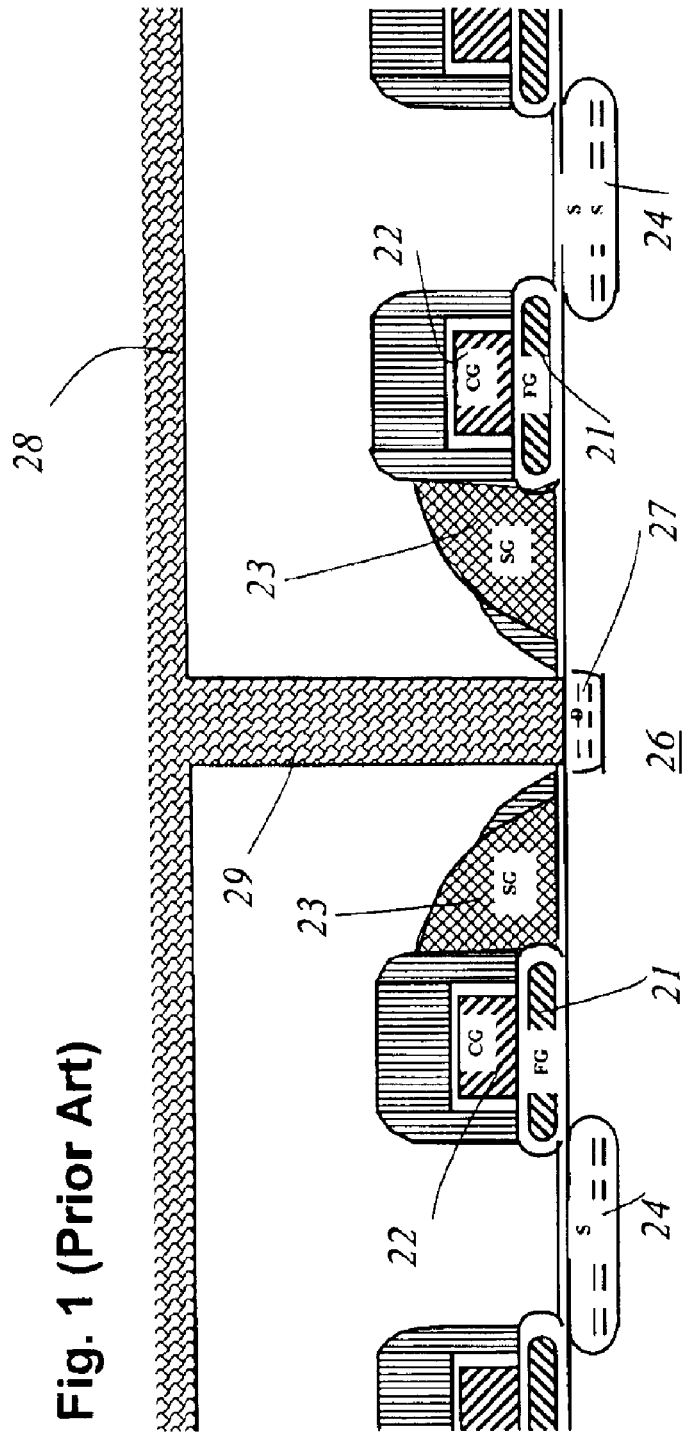
FIG. 1 is a fragmentary cross-sectional view of a split-gate flash memory array of the prior art.

With the trench select gates, the lateral dimension of the channel is substantially less than in the NOR flash cells illustrated in FIG. 1, and cell size is substantially reduced. In addition, with the increased height of the trench select gates, the self-aligned bit line contacts, which use the dielectric spacers as contact etch stoppers, are easier to fabricate, and cell size is reduced still further.

Figure 3B:
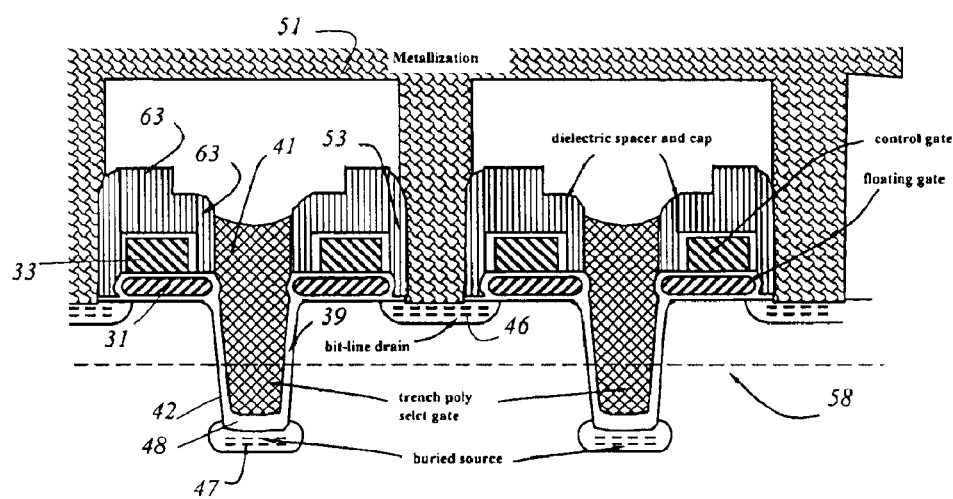
FIG. 3B is cross-sectional views taken along line 3B—3B in FIG. 4B of another embodiment of a flash memory array incorporating the invention.
Figure 4B:
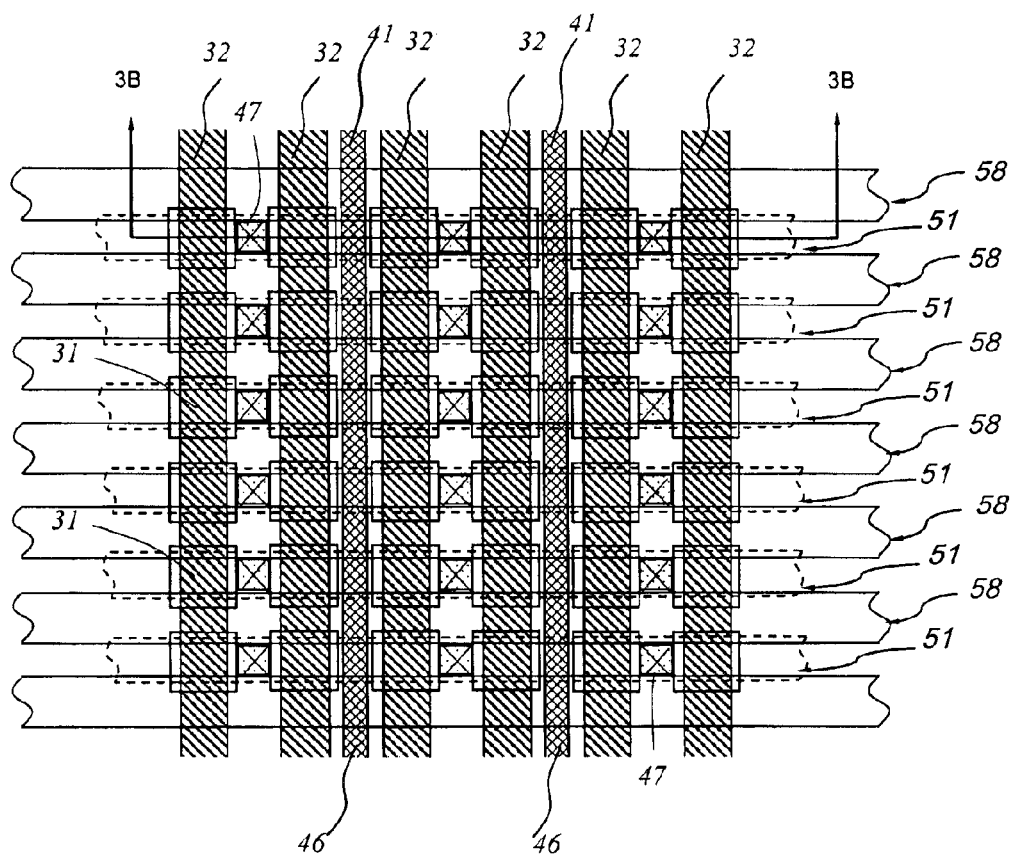

Another embodiment of a NOR flash memory array with trench select gates is illustrated in FIGS. 3B and 4B. In this embodiment, the source nodes are trench-gated, but neighboring cells share bit line contacts as in ETOX technology, with drain regions 46 being formed near the surface of the substrate rather below trenches. Select gates 41 are provided only on the source-side of the floating and control gates, and are merged together as in the embodiment of FIG. 3A. The trenches for these gates are substantially deeper than in the FIG. 3A embodiment in order to have source continuity, which allows the select gates to be even taller.

Operation of the array of FIG. 3B differs from that of FIG. 3A in that programming takes place from the source-side trench gate, rather than the drain-side select gate, although the same mid-channel injection is employed in both embodiments. Also, in the cells of FIG. 3B, over-erase problems can be prevented either by the use of a negative control gate voltage to turn off an unselected cell or by the use of a smart algorithm to keep the threshold voltage in a narrow range near 1 volt during erase operations.

FIGS. 3C and 4C illustrate a high density flash array having a buried bit line drain, a buried source, and trench select gates. This embodiment is an improvement over the contactless bit line array disclosed in U.S. Pat. No. 6,426,896. In that array, buried source and drain stripes parallel to a control gate are used as a bit line perpendicular to the polysilicon select gate stripe that runs across the buried bit line source, the buried bit line drain, and the control gate.

In the embodiment of FIG. 3C, both the buried drains 46 and the buried source nodes 47 are self-aligned with the trenched select gates 41, and serve as bit lines for accessing data at addresses which are decoded by the control gates. The buried bit lines are thus parallel to the select gates, rather than being perpendicular to them as in the array shown in U.S. Pat. No. 6,426,896. The select gates are shared between neighboring cells, and the shared, trenched in combination with the buried bit lines further minimize cell and array size, and also provide improved erase and programming efficiency.

Programming is done by the select gate on one side of the floating and control gates, e.g. the source side, for mid-channel injection, with the select gate on the other side passing 6 volts to the drain-side edge of the floating gate. During erase operations, electrons tunnel from the floating gate to both of the trenched select gates. To read data from a cell, both select gates are biased to $V_{CC}$, with the buried sources grounded and the drain biased to -2 volts. To prevent over-erase of unselected cells along a buried bit line pair, either a negative control gate voltage or a smart algorithm can be employed.

The memory cell array of FIG. 3A can be fabricated by the process illustrated in FIGS. 5A–5F. In this process, an oxide layer 56 is thermally grown to a thickness of about 70 Å to 250 Å on a silicon substrate 36 which can be in the form of a P-well, P-substrate or N-well material. The active area 57 of the substrate is isolated by field isolation which preferably is in the form of shallow isolation trenches 58.

A conductive layer 59 of polysilicon or amorphous silicon (poly-1) is deposited on the thermal oxide to a thickness on the order of 100 Å to 1000 Å. The poly-1 is first pre-patterned in the direction parallel to the bit line and field isolation, then a dielectric film 61 (the inter-poly dielectric) is formed on it. The silicon is preferably doped with phosphorus, arsenic or boron to a level on the order of $10^{17}$ to $10^{20}$ per cm$^3$. The doping can be done in-situ during deposition of the silicon or by ion implantation directly into the silicon or through the dielectric 61 above it.

The inter-poly dielectric can be either a pure oxide or a combination of oxide, nitride and oxide (ONO), and in the embodiment illustrated, it consists of a lower oxide layer having a thickness on the order of 30–100 Å, a central nitride layer having a thickness on the order of 60–300 Å, and an upper oxide layer having a thickness on the order of 30–300 Å.

A second layer of polysilicon 62 (poly-2) is deposited on dielectric film 61, and is subsequently etched to form the control gates 32. This layer has a thickness on the order of 1500 Å–3500 Å, and is doped with phosphorus, arsenic or boron to a level on the order of $10^{20}$ to $10^{21}$ per cm$^3$.

A CVD oxide or nitride layer 63 having a thickness on the order of 300 Å–1000 Å is deposited on the poly-2 layer, and is used as a mask to prevent the poly-2 material from etching away during subsequent dry etching steps.

Figure 5A:
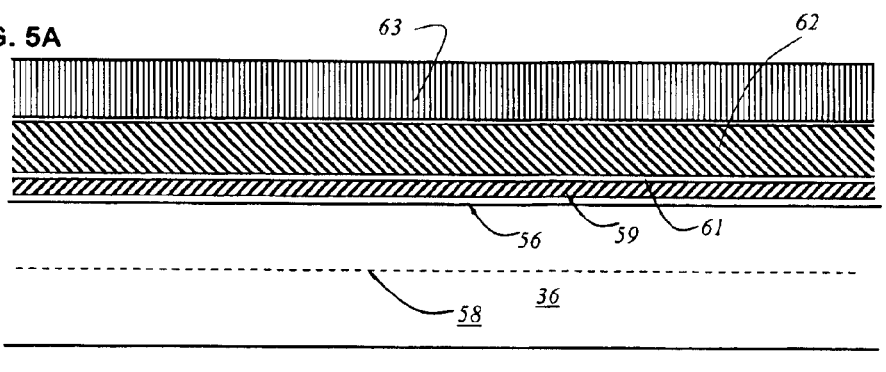
FIGS. 5A–5F are schematic cross-sectional views illustrating the steps in one embodiment of a process for fabricating the flash memory array of FIG. 3A.
Figure 5B:
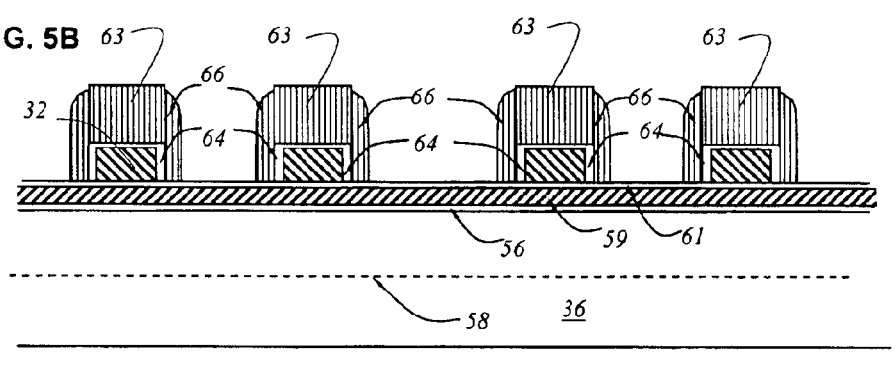

A photolithographic mask (not shown) is formed over layer 63 to define the control gates, and the unmasked portions of that layer and the poly-2 layer etched away anisotropically, leaving only the portions of the poly-2 which form the control gates 32, as illustrated in FIG. 5B.

A thin thermal oxide 64 is grown on the exposed side walls of control gates 32 to protect them from possible damage during a subsequent CVD operation. Thereafter, a dielectric film, such as oxide or nitride, having a thickness on the order of 300 Å–500 Å is deposited across the wafer. That film is then etched anisotropically to remove the dielectric material from the flat areas, leaving dielectric spacers 66 around the sides of the control gates.

The exposed portions of the inter-poly dielectric 61, the underlying portions of the poly-1 layer 59, and the silicon substrate 36 are etched anisotropically to form the individual control and floating gate stacks and the trenches 39 in the substrate. The depth of the trenches in this embodiment is preferably less than that of shallow isolation trenches 58 in order to maintain sufficient isolation between the drains and the isolation trenches.

Figure 5C:
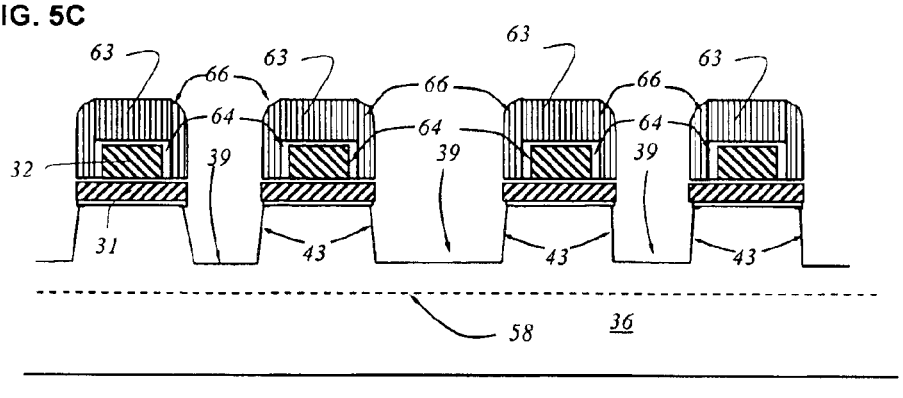

The dielectric layer 63 which serves as a mask is preferably thick enough to permit non-selective anisotropic etching of silicon and oxide without the sharp trench corners which could result if selective silicon etching were used. The non-selective etching of silicon and oxide also results in the side walls 43 of the trenches being inclined at an angle of about 60° to 90°, as illustrated in FIG. 5C, which facilitates the subsequent implantation of the source and drain regions.

Figure 5D:
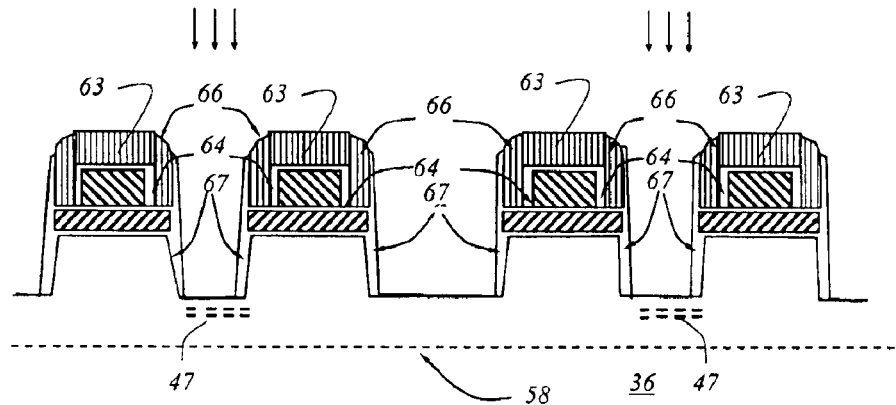

A thin CVD oxide having a thickness on the order of about 200 Å–300 Å is then deposited and anisotropically etched to form spacers 67 on the side walls of the trenches. Source regions 47 are then implanted in the substrate through the bottom walls of the trenches, as illustrated in FIG. 5D, with spacers 67 preventing even trace amount of implant injection in the lateral direction where the gate oxide is to be formed.

Figure 5E:
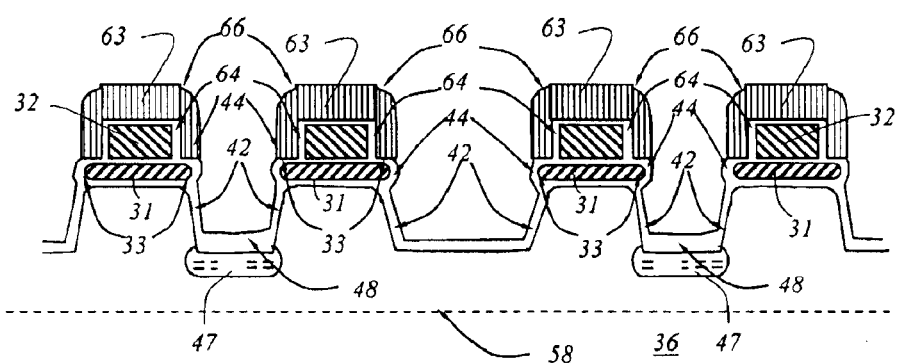
Figure 5F:
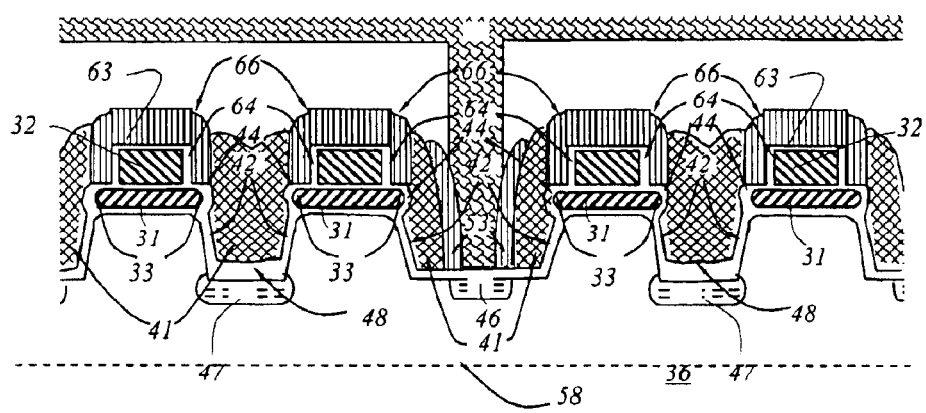

Oxide spacers 67 are then removed, and a thermal oxidation is carried out to form the vertical channel gate oxide 42 for the trench select gates, the tunnel oxide 44 at the edges of the floating gates, and the oxide layer 48 on the bottom walls of the trenches above the source regions, as illustrated in FIG. 5E. Gate oxide 42 preferably has a thickness on the order of 100 Å–400 Å, and more preferably 100 Å–300 Å.

A thin CVD oxide having a thickness of about 50 Å–200 Å can be deposited either before or after the thermal oxidation to improve the quality of the oxide films and reduce disturbances between the select gates and the floating gates.

The side walls or edges 33 of the floating gates become rounded during thermal oxidation because the oxidation rate of the polysilicon is faster near the interface between it and the dielectric materials above and below it. The sharp, rounded curvature results in an electric field enhancement which facilitates electron tunneling from the floating gates to the select gates.

Moreover, the rounding of the side walls eliminates the localized trapping effect that occurs in the tunnel oxide near the square corners of a floating gate when a cell operates in erase mode and the electrons tunnel from the floating gates to the select gates. Furthermore, the additional volume of oxide grown from the corners of the trenches and the surfaces directly beneath the edges of the floating gates helps to prevent oxide re-entrant which is common in split gate structures. Thus, the rounded edges enhance the program-and-erase performance of the memory cells.

As a result of these processing steps, each of the control gates is self-aligned to the floating gate beneath it, and the control gate is narrower than the floating gate, with the edges of the floating gate extending laterally beyond the edges of the control gate.

Following thermal oxidation, a conductive layer, not shown, typically a doped polysilicon or polycide (poly-3), is deposited over the entire wafer, then etched anisotropically to form select gates 41. The poly-3 material has a thickness on the order of 500 Å–1000 Å, and the select gates merge together in the trenches on the source side of the stacked gates, but not on the drain side.

A relatively thin layer (e.g., 200 Å–600 Å) of silicon nitride is deposited on the exposed side walls of the select gates on the drain side and etched to form dielectric spacers 53. Drain region 47 is implanted beneath the bottom wall of the trench, using spacers 53 as a mask, and the wafer is then metalized to form bit line 51 and bit line contact 52. Being formed in this manner the drain region and the bit line contact are self-aligned.

The poly-3 layer in this embodiment is thinner than in prior art devices where the poly-3 is 1500 Å–4000 Å, and the thinner poly-3 simplifies formation of spacers 53, drain region 47 and bit line contact 52, and thus makes cell size reduction even easier.

Figure 6A:
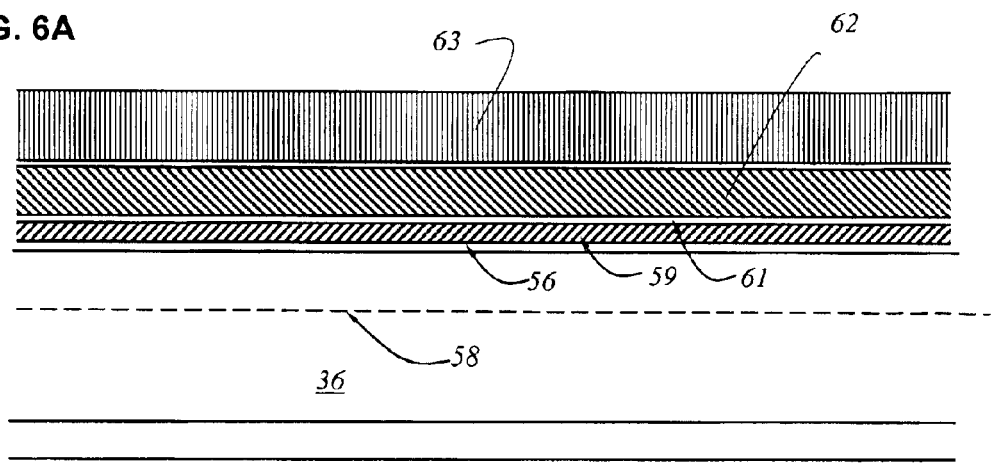
FIGS. 6A–6F are schematic cross-sectional views illustrating the steps in one embodiment of a process for fabricating the flash memory array of FIG. 3B.
Figure 6B:
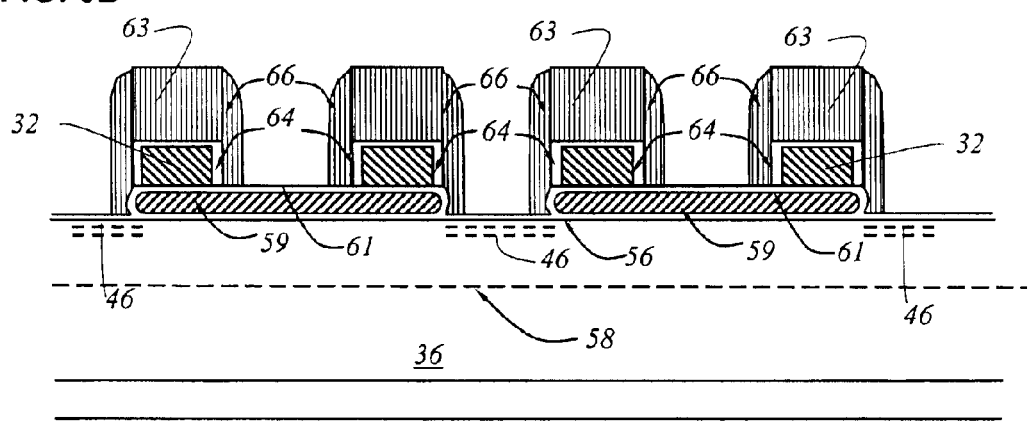

A process for fabricating the NOR cell array of FIG. 3B is illustrated in FIGS. 6A–6F. This process is similar to the process of FIGS. 5A–5F, the main difference being that after the control gates are formed, the poly-1 layer 59 is removed only in the bit line drain areas, as shown in FIG. 6B, following which drain regions 46 are implanted. Thermal oxide 64 is grown on the side walls of the control gates, and dielectric spacers 66 are formed on the sides of the stacked gates.

Figure 6C:
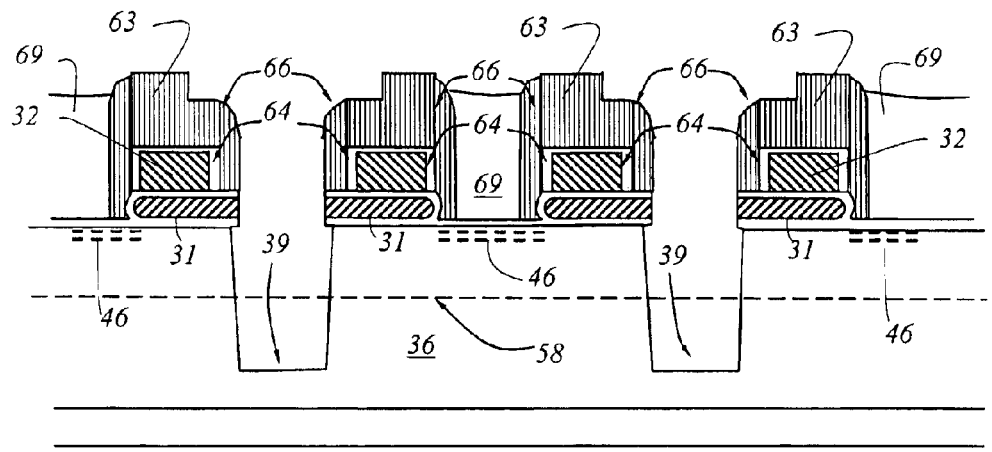

Planarized oxide 69 is formed over the drain regions, following which inter-poly dielectric 61, poly-1 layer 59, and silicon substrate 36 are etched anisotropically to form the trenches 39, as illustrated in FIG. 6C. The depth of the trenches in this embodiment is preferably greater than that of shallow isolation trenches 58 in order to provide buried source continuity.

Figure 6D:
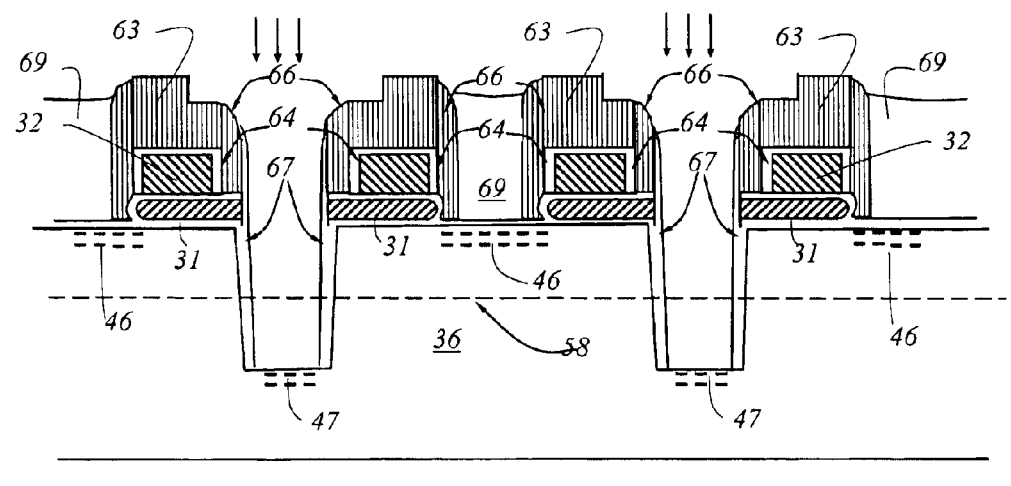
Figure 6E:
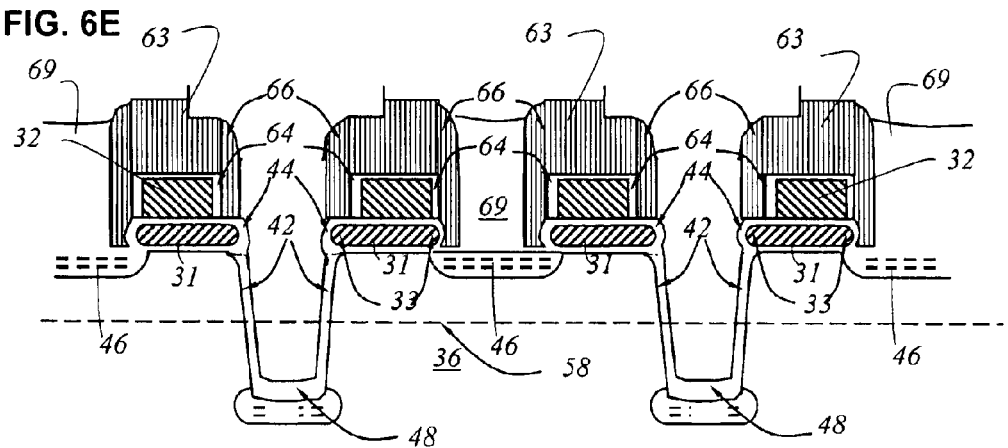
Figure 6F:
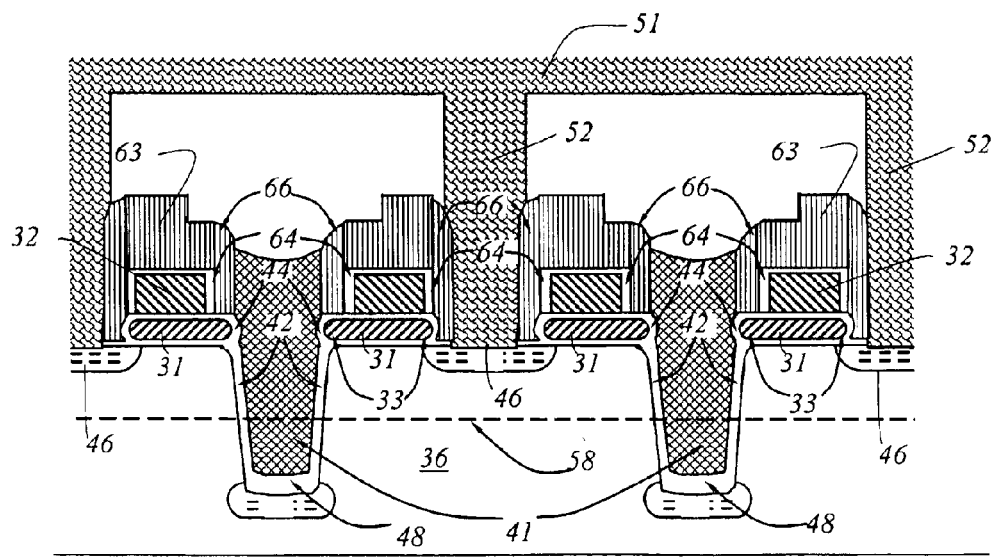

Oxide spacers 67 are formed on the side walls of the trenches, and source regions 47 are implanted beneath the trenches, as illustrated in FIG. 6D. The oxide spacers are removed, gate oxide 42, tunnel oxide 44, and oxide layer 48 are formed as in the embodiment of FIGS. 5A–5F, and the conductive material for select gates 41 is deposited in the trenches. Oxide 69 is removed, and bit line 51 and contacts 52 are formed, as illustrated in FIG. 6F.

FIGS. 7A–7J illustrate a process for fabricating the memory cell array of FIG. 3C. In this embodiment, control gates 32, dielectric caps 63, oxide 64, and spacers 66 are formed in the same manner as in the process of FIGS. 5A–5F, except poly-1 layer 59 is not pre-patterned as it is in the earlier embodiment.

Figure 7A:
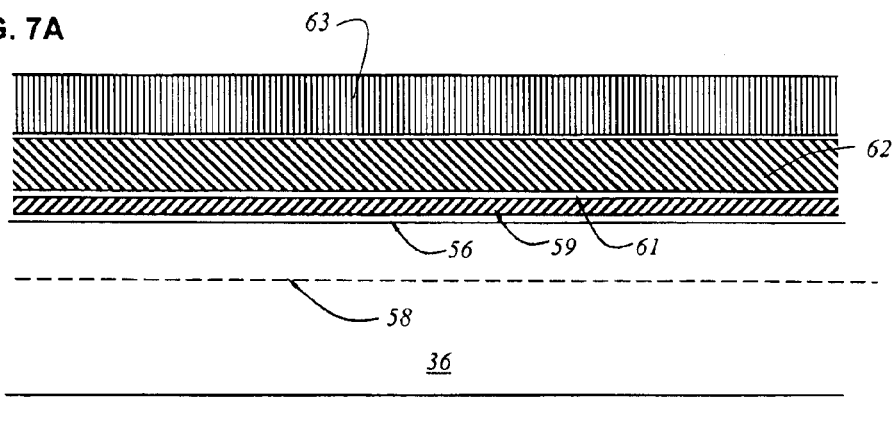
FIGS. 7A–7E and 7F–7J are schematic cross-sectional views and isometric views illustrating one embodiment of a process for fabricating the flash memory array of FIG. 3C.
Figure 7B:
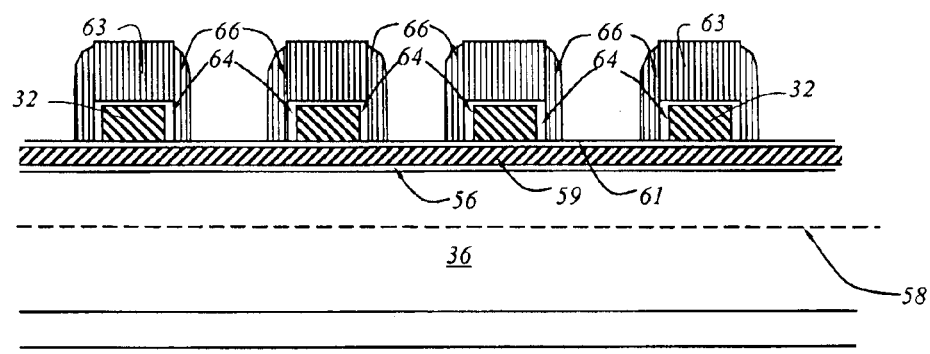
Figure 7C:
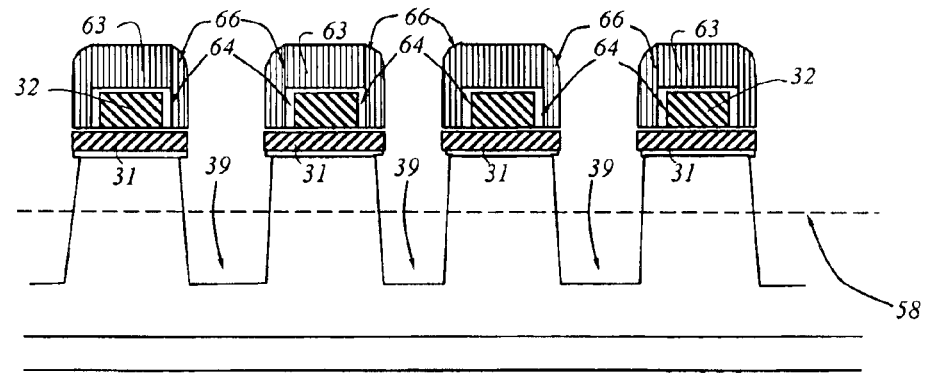
Figure 7D:
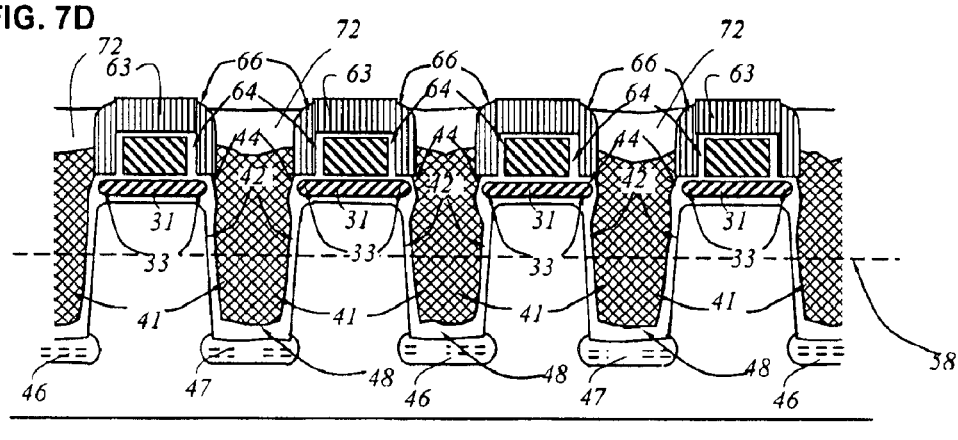

Using dielectric 63, 66 as a mask, inter-poly dielectric 61, poly-1 layer 59, and silicon substrate 36 are etched anisotropically to form both source and drain region trenches 39, as illustrated in FIG. 7C. The depth of the trenches in this embodiment is preferably greater than that of shallow isolation trenches 58 in order for buried source and drain continuity.

The side walls of the trenches are protected by spacers, as in the previous embodiments, and drain and source regions 46, 47 are implanted beneath the trenches. The protective spacers are removed, and trench gate oxide 42 is grown. The poly-3 for select gates 41 is deposited to fill the trenches and etched back below the tops of control gate caps 63, following which the trenches are filled with oxide 72.

At this point, a resist-masked, non-selective etching of the nitride, silicon and oxide is carried out to form a second set of trenches 74 in the direction parallel to shallow isolation trenches 58 and perpendicular to trenches 39 and the buried bit lines formed by source and drain stripes. Trenches 74 cut through the floating gate poly-1 layer and the control gate poly-2 layer, but not through the lower portions of trench gates 48. This isolates floating gates 31 and control gates as individual bits, and also permits the poly-2 control gates to be reconnected in the direction perpendicular to the bit lines. Select gates 41 remain connected beneath trenches 74.

Figure 7E:
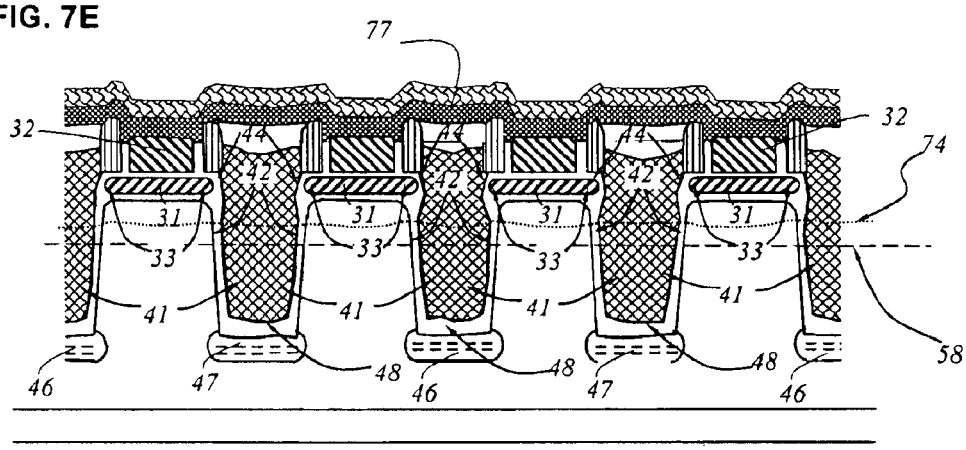

Trenches 74 are filled with CVD oxide 76, and oxide 72 is planarized back to the nitride caps 63 on the control gates. The exposed caps permit self-aligned etching to form contact openings for connecting word lines 77 to the control gates. The word lines are formed by an interconnect layer of polysilicon or polycide is deposited and patterned over the poly-2 in the direction parallel to the shallow isolation trenches 58, as illustrated in FIG. 7E.

Figure 7F:
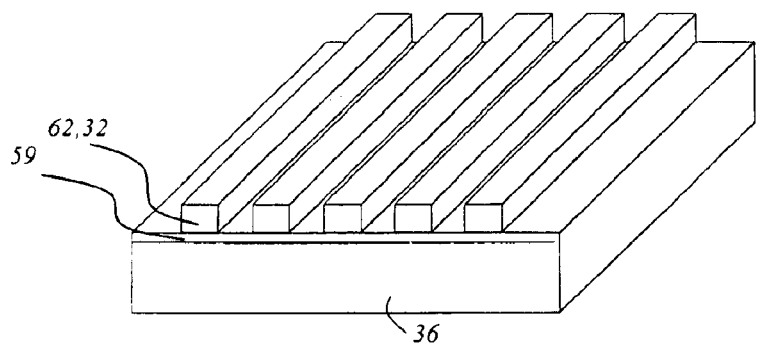
Figure 7G:
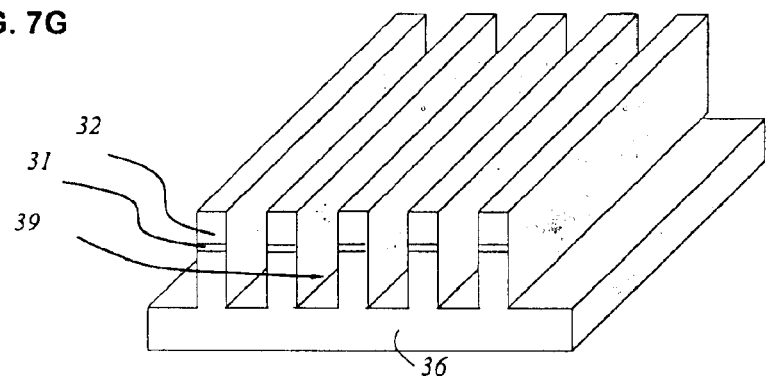

The isometric views of FIGS. 7F–7J illustrate the relationship between the two sets of trenches. FIG. 7F shows substrate 36 with the unpatterned poly-1 layer 59 and the poly-2 layer which has been etched to form control gates 32. FIG. 7G shows the structure after the poly-1 layer has been etched to form floating gates 31 and trenches 39 have been formed.

Figure 7H:
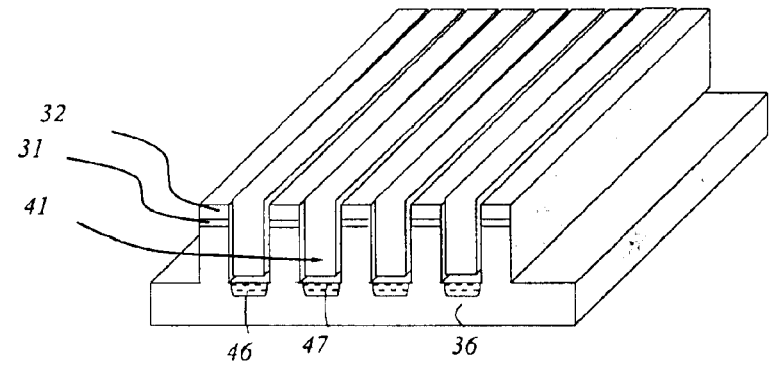
Figure 7I:
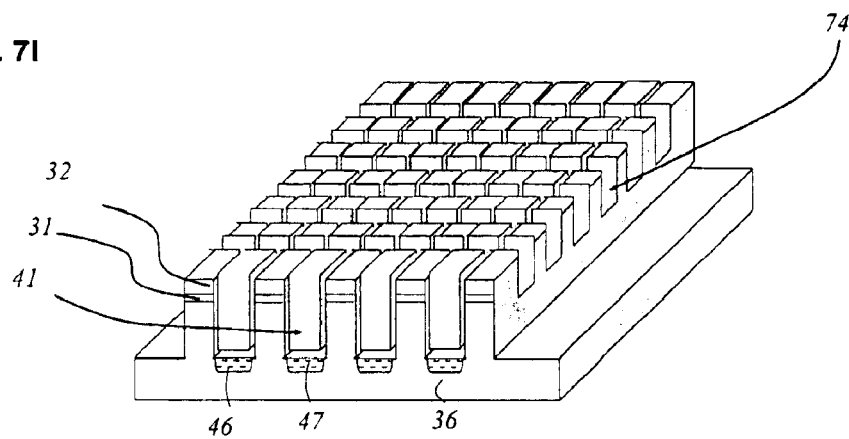
Figure 7J:
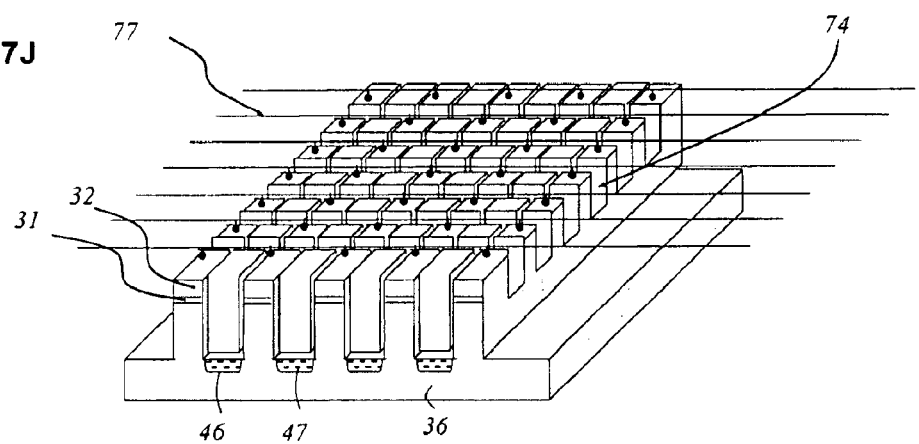

In FIG. 7H, drain regions 46 and source regions 47 have been implanted beneath the bottom walls of trenches 39 to form the buried bit lines, and in FIG. 7I, trenches 74 have been formed. FIG. 7J shows how the word lines 77 interconnect the control gates in the direction perpendicular to the bit lines.

Operation and use of the memory cells of FIGS. 3A–3C can be described with reference to Tables 1A–1C where exemplary bias voltages for erase, program and read operations are shown (in volts).

TABLE 1A

| | Control Gate | | Select Gate | | Bit Line | | Source | |
|---|---|---|---|---|---|---|---|---|
| Mode | Select | Unselect | Select | Unselect | Select | Unselect | Select | Unselect |
| Erase | −7 to −12 | 0 | 3–7 | 0 | Floating | Floating | Floating | Floating |
| Program | 7–12 | 0 | 1.5–3 | 0 | 0 | 1–3 | 4–8 | 0 |
| Read | 1–3 | 1–3 | 3–5 | 0 | 1.5–3 | 0 | 0 | 0 |

TABLE 1B

| Mode | Control Gate Select | Control Gate Unselect | Bit Line Select | Bit Line Unselect | Source Select Gate Select | Source Select Gate Unselect | Source Select | Source Unselect |
|---|---|---|---|---|---|---|---|---|
| Erase | −7 to −12 | 0 | Floating | Floating | 3–7 | Floating | Floating | Floating |
| Program | 7–12 | −5 to −7 | 4–8 | 0 | 3–5 | 0 | 1.5–3 | 1–3 |
| Read | 1–3 | −5 to −7 | 0 | 0 | 3–5 | 0 | 1.5–3 | 0 |

TABLE 1C

| Mode | Control Gate Select | Control Gate Unselect | Bit Line Drain Select Gate Select | Bit Line Drain Select Gate Unselect | Bit Line Drain Select | Bit Line Drain Unselect | Bit Line Source Select Gate Select | Bit Line Source Select Gate Unselect | Bit Line Drain Select | Bit Line Drain Unselect |
|---|---|---|---|---|---|---|---|---|---|---|
| Erase | −7 to −12 | 0 | 3–7 | 0 | Floating | Floating | 3–7 | 0 | Floating | Floating |
| Program | 7–12 | −5 to −7 | 1.5–3 | 0 | 0 | 0 | 4–8 | 0 | 4–8 | 0 |
| Read | 1–3 | −5 to −7 | 3–5 | 0 | 1.5–3 | 0 | 3–5 | 0 | 0 | 0 |

During an erase operation, Fowler-Nordheim tunneling causes electrons to tunnel from the floating gate to the erase gate, leaving the floating gate charged with positive ions. Normally, Fowler-Nordheim tunneling is not significant unless the electric field across the tunnel oxide is stronger than about 10 mV/cm. However, with the electric field enhancement due to the rounded edges of the floating gate, the voltage required for Fowler-Nordheim tunneling is reduced. The enhanced field also makes it possible to use a thicker tunnel oxide while still maintaining sufficient electron tunneling.

In the erase mode, the control gate of a selected cell is biased to a level on the order of −7 to −12 volts, the select gate is biased to a level on the order of 3 to 7 volts, and the bit line and source nodes are floating. Alternatively, the control gate can be grounded and the select gate biased to a more positive level, e.g. 10 volts.

With these bias conditions and the close coupling between the floating and control gates, most of the voltage applied to the control gate (e.g., 65–80 percent) is coupled to the floating gate. That causes most of the voltage difference between the control gate and the select gate to appear across the tunnel oxide surrounding the rounded side wall of the floating gate, which triggers Fowler-Nordheim tunneling, with electrons tunneling from the floating gate to the select gate.

As the floating gate becomes more positively charged, the threshold voltage of the memory cell decreases to a level on the order of −1 to −5 volts. This results in an inversion layer in the channel under the floating gate when the control gate is biased at about 1–3 volts. Therefore, the memory cell goes into the conductive state (logic "1") after the erase operation. In the unselected cells, the control gates are biased to 0 volts, and the select gates are biased to about 3–7 volts, which makes the electric field across the tunnel oxide too weak to produce Fowler-Nordheim tunneling.

During a program operation, electrons are injected into the floating gate from the mid-channel region by hot carrier injection, and the floating gate becomes negatively charged. In this mode, the control gate of a selected cell is biased to about 7–12 volts, the select gate is biased to about 1.5–3 volts, the bit line is biased to 0 volts, and about 4–8 volts is applied to the source node. Alternatively, in the embodiments of FIGS. 3B and 3C, the source node can be tied to the select gate, in which case a slightly higher voltage (e.g., 4.5–8.5 volts) can be applied to the source node in order to pass the necessary voltage to the edge of the floating gate.

With these bias conditions, most of the source-to-drain voltage appears across the mid-channel region between the select gate and the floating gate, producing a strong electric field in the mid-channel region. In addition, the floating gate is maintained at a relatively high voltage by the voltages on the source node and the control gate. As a result, a strong vertical electric field is established across the oxide between the mid-channel region and the floating gate. When the electrons flow from the vertical trench gated bit line to the source, gated or not, they are accelerated by the high electric field in the mid-channel region, and some of them become heated.

Mid-channel injection is further enhanced by the momentum of the electrons toward the floating gate. Being accelerated by the vertical electric field of the floating gate and the gap between the floating gate channel and the vertical gated channel, the majority of the hot electrons surpass the oxide barrier height of about 3.2 eV and are injected into the floating gate. This programming process is more efficient than in the prior art where electron acceleration occurs only in the horizontal direction.

Upon completion of a programming operation, the floating gate is negatively charged, and the threshold voltage of the cell increases to a level on the order of 3–6 volts. Thus, the cell is turned off when the control gate is biased to 0 volts during a read operation. Following a program operation, the memory cell goes into a non-conductive state (logic "0").

In the unselected memory cells, the bit line and source nodes are biased to 0 volts, the control gate is biased to −5 to −7 volts, and the select gate is biased to about 1.5–3 volts. The bias on the control gate turns off the channel beneath the floating gate, which prevents current flow between the bit line and the source in the unselected cells.

In the read mode, the selected memory cells are biased with 1–3 volts on the control gate, 1.5–3 volts on the source, 0 volts on the bit line, and 3–5 volts on the source. Alternatively, as in the programming mode, the drain can be tied to the vertical trench gate in the embodiments of FIGS. 3B and 3C, in which case a voltage of 2–3.5 volts is applied to them to pass the 1.5–3 volts from the gate to the source side edge of the floating gate.

In an erased state, the read shows a conductive state (logic "0") because both the floating gate channel and the select gate channel are turned on. In a programmed state, the read shows a non-conductive state (logic "0") because the floating gate channel is turned off.

In the unselected memory cells, the bit line and source nodes are biased to 0 volts, the control gate is at −5 to −7 volts, and the select gate is at 3–5 volts. The bias to the control gate turns off the channel beneath the floating gate, which prevents current flow between the bit line and the source of the unselected cell.

Figure 8A:
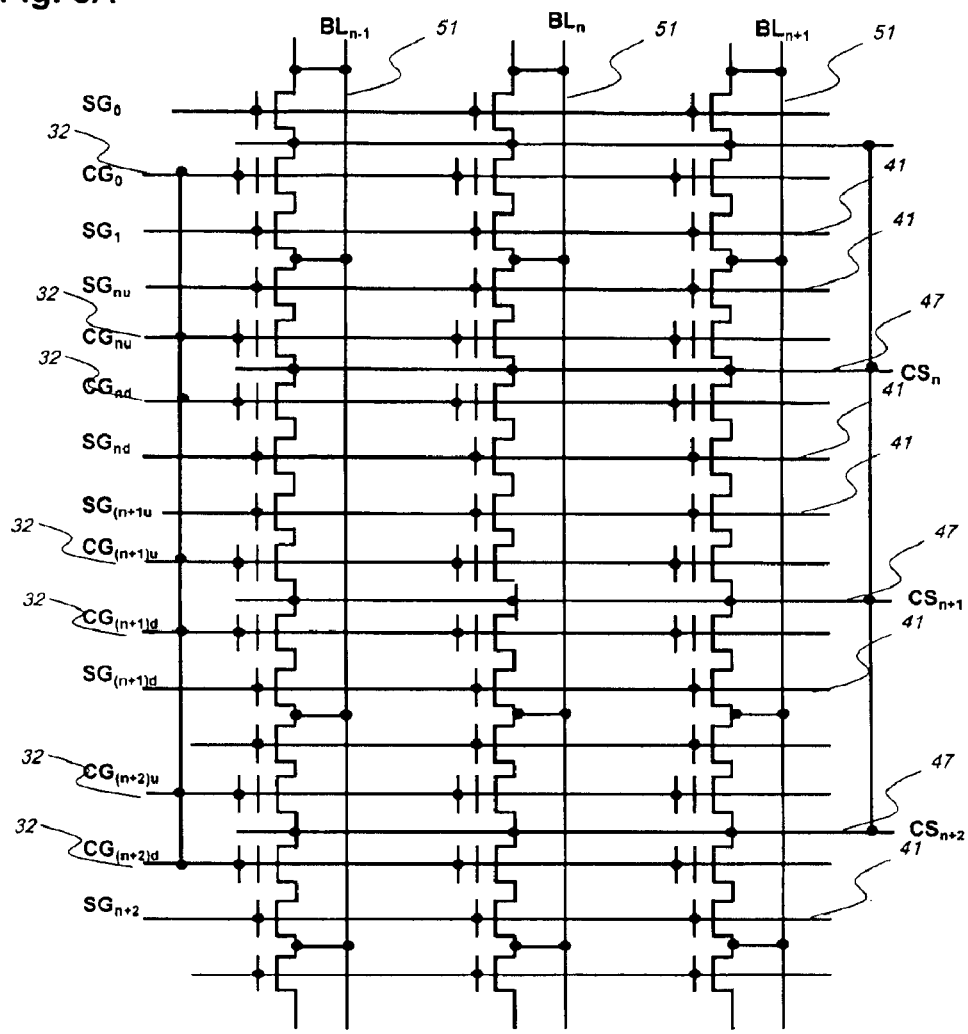
FIGS. 8A–8C are circuit diagrams of the memory arrays of FIGS. 3A–3C.
Figure 8B:
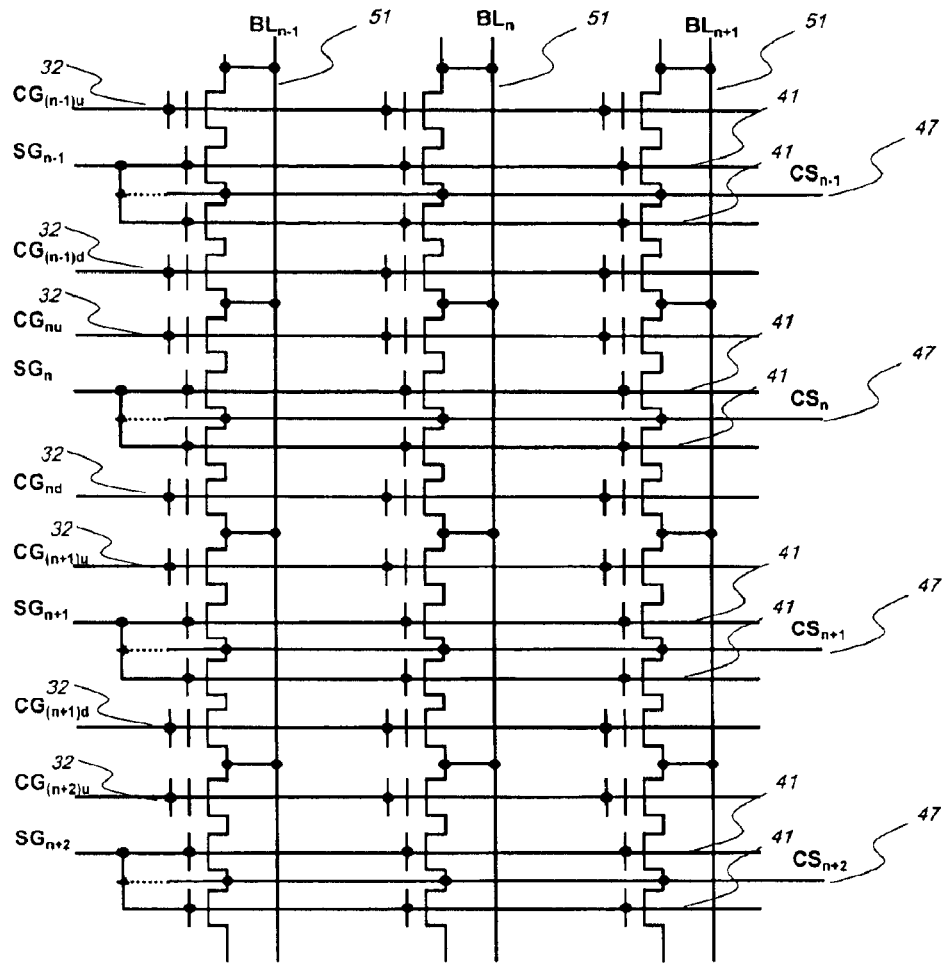
Figure 8C:
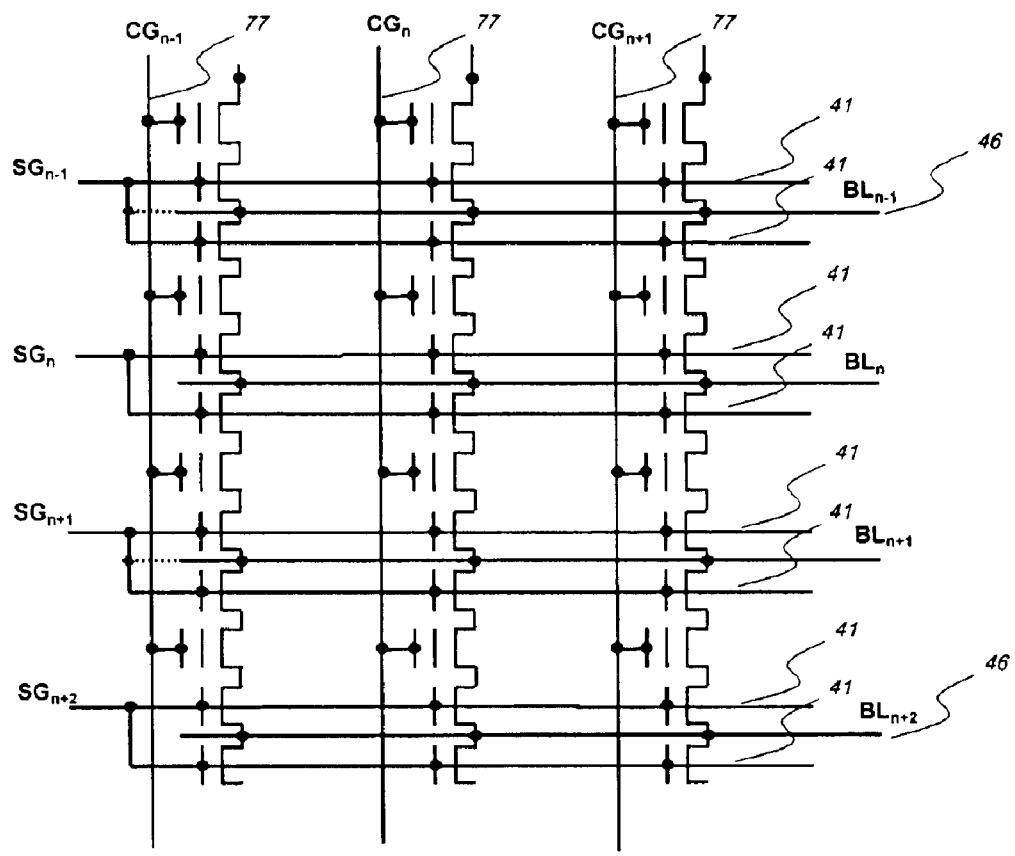

Circuit diagrams for the embodiments of FIGS. 3A–3C and 4A–4C are illustrated in FIGS. 8A–8C, with the bias voltages for erase (ERS), program (PGM) and read (RD) operations are shown next to the terminals of the memory cells.

The invention has a number of important features and advantages. The trench select gate and the vertical channel associated with it make it possible to significantly reduce the size of the memory cells and array. Cell size is further reduced by the sharing of one gated source and drain between two adjacent floating gates and the elimination of bit line contacts. With the floating gate and the control gate being self-aligned with each other, the select gates being self-aligned with the floating and control gates, and the source and drain also being self-aligned and buried, the cells are also substantially more uniform than memory cells of the prior art.

It is apparent from the foregoing that a new and improved flash memory cell and fabrication process have been provided. While only certain presently preferred embodiments have been described in detail, as will be apparent to those familiar with the art, certain changes and modifications can be made without departing from the scope of the invention as defined by the following claims.

What is claimed is:

1. A flash memory, comprising: a substrate, a floating gate, a control gate stacked above the floating gate, a trench in the substrate to one side of the floating gate, a select gate disposed partly within the trench and partly along the side of the floating gate and the control gate, source and drain regions in the substrate near the select gate and the floating gate, a bit line overlying the gates, and a bit line contact separate and apart from the select gate interconnecting the bit line and the drain region.

2. The flash memory of claim 1 wherein the select gate extends to a greater height than the control gate, and at least about half of the select gate is in the trench.

3. The flash memory of claim 1 wherein the source region is positioned beneath the select gate, and the drain region is positioned near the surface of the substrate to the side of the floating gate opposite the select gate.

4. A flash memory, comprising: a substrate, a floating gate, a control gate stacked above the floating gate, a trench in the substrate to one side of the floating gate, a select gate disposed partly within the trench and partly along the side of the floating gate and the control gate, source and drain regions in the substrate near the select gate and the floating gate, and a dielectric cap on the control gate, with the select gate extending to a level between the top of the control gate and the top of the dielectric cap.

5. A flash memory, comprising: a substrate, a floating gate, a control gate stacked above the floating gate, a trench in the substrate to one side of the floating gate, a select gate disposed partly within the trench and partly along the side of the floating gate and the control gate, with the floating gate having a rounded side edge that extends laterally beyond the control gate toward the select gate, and source and drain regions in the substrate near the select gate and the floating gate.

6. A flash memory, comprising: a substrate, a floating gate, a control gate stacked above the floating gate, trenches in the substrate on opposite sides of the floating gate, select gates disposed partly within the trenches and partly along the sides of the floating gate and the control gate, source and drain regions in the substrate beneath the select gates, a bit line positioned above the gates and a bit line contact separate and apart from the select gates which extends into one of the trenches and interconnects the bit line and the drain region.

7. The flash memory of claim 6 further including word lines connected to the control gates above the substrate.

8. A flash memory, comprising: a substrate, a floating gate, a control gate stacked above the floating gate, trenches in the substrate on opposite sides of the floating gate, select gates disposed partly within the trenches and partly along the sides of the floating gate and the control gate, source and drain regions in the substrate beneath the select gates, and a dielectric cap on the control gate, with the select gates extending to a level between the top of the control gate and the top of the dielectric cap.

9. A flash memory, comprising: a substrate, a floating gate, a control gate stacked above the floating gate, trenches in the substrate on opposite sides of the floating gate, select gates disposed partly within the trenches and partly along the sides of the floating gate and the control gate, with the floating gate having rounded side edges that extend laterally beyond the control gate toward the select gates, and source and drain regions in the substrate beneath the select gates.

10. A flash memory, comprising: a substrate, a plurality of memory cells each having a floating gate and a control gate, trenches in the substrate between facing sides of adjacent ones of the cells, select gates disposed within the trenches and along the facing sides of the floating gates and control gates, source regions in the substrate beneath the select gates, drain regions in the substrate on the sides of the floating gates opposite the trenches, a bit line positioned above the gates, and bit line contacts separate and apart from the select gates interconnecting the bit line and the drain regions.

11. The flash memory of claim 10 wherein the control gates are stacked on the floating gates, and the select gates extend to a height above the control gates.

12. A flash memory, comprising: a substrate, a plurality of memory cells each having a floating gate and a control gate, trenches in the substrate between facing sides of adjacent ones of the cells, select gates disposed within the trenches and along the facing sides of the floating gates and control gates, with the floating gates having rounded edges which extend laterally beyond the control gates toward the trenches, source regions in the substrate beneath the select gates, and drain regions in the substrate on the sides of the floating gates opposite the trenches.

13. A flash memory, comprising: a substrate, a plurality of memory cells each having a floating gate and a control gate, trenches in the substrate between the cells, select gates disposed within the trenches and along the sides of the floating gates and control gates, source regions and drain regions in the substrate beneath the select gates, a bit line positioned above the gates and bit line contacts which extend from the bit line and pass between the select gates in the trenches above the drain regions and interconnect the bit line and the drain regions.

14. The flash memory of claim 13 wherein the control gates are stacked on the floating gates, and the select gates extend above the control gates.

15. The flash memory of claim 13 including word lines connected to the control gates.

16. A flash memory, comprising: a silicon substrate having an active area, an oxide layer formed on the substrate above the active layer, relatively thin floating gates having side walls with a rounded curvature positioned above the oxide layer, control gates which are substantially thicker than the floating gates positioned above and in vertical alignment with the floating gates, a dielectric layer between the control gates and the floating gates, dielectric caps on the control gates, dielectric spacers on both sides of the control gates, trenches formed in the substrate on at least one side of the floating gates, select gates covering at least one side of the control gates and the floating gates and extending into the trenches, source regions in the substrate, drain regions serving as bit line diffusions in the substrate, a tunnel oxide between the rounded side walls of the floating gates and the select gates, a dielectric which is thicker than the tunnel oxide between the control gates and the select gates, tunneling paths for electrons during an erase operation extending from the rounded side walls of the floating gates through the tunnel oxide to the select gates, and hot carrier injection paths for electrons during a program operation extending from vertical channel regions between the select gates and the floating gates through the gate oxide to the side walls of the floating gates.

17. The flash memory of claim 16 wherein the bit line diffusions are positioned beneath central portions of trenches between and self-aligned with the select gates for two adjacent memory cells, whereby two select gate transistors are formed with the two select gates sharing a single bit line diffusion.

18. The flash memory of claim 16 wherein the bit line diffusions are buried in the substrate beneath alternate ones of the trenches, the floating gates and control gates in memory cells on opposite sides of the trenches share common select gates, and the select gate transistors for the cells use the same select gate and bit line diffusion.

19. The flash memory of claim 16 wherein the trenches have side walls which are inclined at angles on the order of 70°–90°.

20. The flash memory of claim 16 wherein each of the trenches is continuous.

21. The flash memory of claim 16 wherein the trenches are isolated by field isolation.

22. The flash memory of claim 16 wherein the source and/or drain regions are connected electrically to the select gates so that the select gates can function both as gating transistors and as pass transistors during operation of the memory.

23. The flash memory of claim 16 wherein the side walls of the floating gates extend laterally beyond the control gates toward the select gates, and the control gates are high voltage coupled to the floating gates.

24. The flash memory of claim 16 wherein the dielectric caps on the control gates have a thickness on the order of 300 Å–1000 Å, and the dielectric spacers on the sides of the control gates have a thickness on the order of 200 Å–500 Å.

25. The flash memory of claim 16 wherein the dielectric cap and spacers are used as a mask for non-selective etching of silicon and silicon oxide in the formation of the floating gates and the trenches.

26. The flash memory of claim 16 wherein the dielectric caps and spacers are a silicon nitride material.

27. The flash memory of claim 16 wherein the dielectric caps and spacers are a silicon oxide material.

28. The flash memory of claim 16 wherein the select gates are formed by depositing polysilicon so that it fills the trenches and covers the control gates, and etching the polysilicon back to a height between the tops of the control gates and the caps.

29. The flash memory of claim 16 wherein the bit line diffusions are formed beneath alternate ones of the trenches by ion implantation using the caps and spacers on the control gates as a mask so that the diffusions are self-aligned with the gates.

30. The flash memory of claim 16 wherein the bit line diffusions are buried beneath the trenches and are interconnected in a direction perpendicular to the select and control gates.

31. The flash memory of claim 16 including a bit line which interconnects the bit line diffusions and extends in a direction perpendicular to the trenches.

32. The flash memory of claim 16 including a word line which interconnects the control gates and extends in a direction perpendicular to the bit line diffusions and the trenches.

33. The flash memory of claim 16 wherein the bit line diffusions are buried in the substrate beneath alternate ones of the trenches and are physically and electrically separated from the select gates in the trenches.

34. The flash memory of claim 16 wherein the source regions are buried in the substrate beneath alternate ones of the trenches and are physically and electrically separated from the select gates in the trenches.

35. The flash memory of claim 16 wherein the bit line diffusions are buried in the substrate beneath alternate ones of the trenches and are physically and electrically connected to the select gates in the trenches.

36. The flash memory of claim 16 wherein the source regions are buried in the substrate beneath alternate ones of the trenches and are physically and electrically connected to the select gates in the trenches.

37. The flash memory of claim 16 including isolation trenches which cut through the floating gates and control gates to form isolated gate stacks for different memory cells.

38. The flash memory of claim 37 wherein the isolation trenches extend to a depth less than the trenches in which the select gates are formed so that the lower portions of the control gates extend continuously between the isolated gate stacks.

39. The flash memory of claim 37 wherein the isolation trenches are formed by non-selective etching of silicon, silicon oxide and silicon nitride using a mask of photoresist or a combination of photoresist and silicon nitride.

* * * * *